(12) United States Patent
Ker et al.

(10) Patent No.: US 7,564,317 B2
(45) Date of Patent: Jul. 21, 2009

(54) HIGH/LOW VOLTAGE TOLERANT INTERFACE CIRCUIT AND CRYSTAL OSCILLATOR CIRCUIT

(75) Inventors: Ming-Dou Ker, Hsinchu (TW); Hung-Tai Liao, Taipei (TW); Ryan Hsin-Chin Jiang, Taipei (TW)

(73) Assignee: Amazing Microelectronic Corporation, Taipei County (TW)

( * ) Notice: Subject to any disclaimer, the term of this patent is extended or adjusted under 35 U.S.C. 154(b) by 93 days.

(21) Appl. No.: 11/773,966

(22) Filed: Jul. 6, 2007

(65) Prior Publication Data

US 2009/0009229 A1 Jan. 8, 2009

(51) Int. Cl.
*H03B 5/36* (2006.01)
(52) U.S. Cl. ............... 331/116 FE; 331/158; 331/160; 326/80
(58) Field of Classification Search ............. 331/116 R, 331/116 FE, 158, 160, 183, 185, 186; 327/180, 327/306, 309, 318, 321, 327, 328; 326/80, 326/81
See application file for complete search history.

(56) References Cited

U.S. PATENT DOCUMENTS

| | | | |
|---|---|---|---|
| 3,935,546 A | | 1/1976 | Morozumi et al. |
| 6,181,214 B1 * | | 1/2001 | Schmitt et al. ............... 331/62 |
| 6,215,370 B1 | | 4/2001 | Hasegawa et al. |
| 6,927,602 B2 * | | 8/2005 | Ker et al. ................ 326/81 |
| 2008/0079506 A1 * | | 4/2008 | Chuah et al. ................ 331/109 |

OTHER PUBLICATIONS

Ker et al., "Design of Mixed-Voltage Crystal Oscillator Circuit in Low-Voltage CMOS Technology", May 27-30 2007, Circuits and Systems, 2007. ISCAS 2007. IEEE International Symposium on, pp. 1121-1124.*
Article titled "A 3/5 V Compatible I/O Buffer" authored by Pelgrom et al, IEEE Journal of Solid-State Circuits, vol. 30, No. 7 Jul. 1995 (pp. 823-825).
Article titled "3.3V-5V Compatible I/O Circuit without Thick Gate Oxide" authored by Takahashi et al, IEEE Custom Integrated Circuits Conference, 1992, (pp. 23.3.1-23.3.4).

* cited by examiner

*Primary Examiner*—Robert Pascal
*Assistant Examiner*—Ryan J. Johnson
(74) *Attorney, Agent, or Firm*—Jianq Chyun IP Office

(57) ABSTRACT

A high/low voltage tolerant interface circuit and a crystal oscillator circuit using the same are provided herein. The interface circuit includes a first transistor, a bulk-voltage generator module and an bias module. The first transistor includes a gate, a first source/drain, a bulk coupled to the first source/drain of the first transistor and a second source/drain coupled to an input node. The bulk-voltage generator module is, used to determine whether a first voltage or a predetermined voltage is being provided to the bulk of the first transistor according to the voltage of the input node. The bias module is coupled to the gate of the first transistor. The bias module is used to provide an bias voltage to the gate of the first transistor and makes the first transistor conduct in order to control the voltage of the second source/drain voltage of the first transistor.

23 Claims, 5 Drawing Sheets

HIGH/LOW VOLTAGE TOLERANT INTERFACE CIRCUIT AND CRYSTAL OSCILLATOR CIRCUIT

BACKGROUND OF THE INVENTION

1. Field of the Invention

The present invention generally relates to a high/low voltage tolerant interface circuit, and more particularly, to an interface circuit that uses the bulk voltage of a control transistor to increase the reliability of gate oxide layers and a crystal oscillator using the same.

2. Description of Related Art

In recent years, complementary metal oxide semiconductor (CMOS) technology has played an increasingly important role in the circuit industry around the world. With rapid progress in nanometer-scale processing techniques, the circuit design of a chip can be realized using transistors with a smaller dimension so as to reduce chip area and lower the fabrication cost of the chip. As a result, the voltage of a power supply for powering the chip can be lowered to about 1V in order to reduce power consumption.

However, some of the peripheral devices or integrated circuits of micro-electronic systems still operate at a high voltage in order to be compatible to an earlier interface specification. When a chip using a low power supply voltage and the peripheral devices or integrated circuits are simultaneously operated, an interface circuit between the two is needed to process input and output signals that have different voltages.

A complete input and output library comprises digital and analog input and output cells, system voltage and ground voltage cells and crystal oscillator cells. In related prior art, only the design of mixed voltage input and output circuits have been considered. However, no one has yet proposed an application of the mixed voltage design to a crystal oscillator circuit. If a crystal oscillator circuit that uses a low voltage device is applied to an interface circuit having mixed voltages, then the higher input voltage can probably punch through the gate oxide layer of the transistors of the crystal oscillator circuit.

FIG. 1A is a diagram of a part of a conventional pierce-type crystal oscillator circuit. As shown in FIG. 1A, the crystal 102 is coupled between an input bonding pad X1 and an output bonding pad XO for generating a stable clock signal to an integrated circuit 100 to make it operate. An inverter amplifier 101 is normally integrated to the integrated circuit 100 for providing a voltage gain and a 180° phase-shifted signal.

The two ends of the crystal 102 are coupled to capacitors C1 and C2, respectively. The capacitors C1 and C2 stabilize the frequency of the clock signal and provide a means of routing the 180° phase-shifted signal to a feedback path. A resistor $R_f$ is used to apply an bias of about half of the power supply voltage to the inverter amplifier 101 so as to operate the inverter amplifier 101 in a high-gain linear region.

Although the oscillation of the crystal 102 can generate a clock signal to provide the integrated circuit 100, other external clock can be used as a source of the clock signal required by the integrated circuit 100. In addition, the external clock signal can be transmitted to the integrated circuit 100 through the input bonding pad X1 while the output bonding pad XO is floating.

FIG. 1B is a diagram of a conventional crystal oscillator circuit having low voltage devices. The low voltage devices are devices that operate at a one time the system voltage (1×VDD). As shown in FIG. 1B, P-type transistors P1~P2 and N-type transistors N1~N2 form an inverter amplifier 101.

When the crystal 102 is coupled between the input bonding pad X1 and the output bonding pad XO, the capacitors C1 and C2, which are coupled to the two ends of the crystal 102, can convert the oscillation signal generated by the crystal 102 into a sine wave signal. Through an inverter 103 formed by the combination of a P-type transistor P3 and an N-type transistor P4, the sine wave signal is converted to a square wave clock signal and the square wave clock signal is output to the integrated circuit 100 through a node XC.

When the clock signal of the integrated circuit 100 is provided by an external source, the external clock signal is received through the input bonding pad X1. If the highest operating voltage of the enable signal EN is a one time the system voltage (1×VDD) but the highest operating voltage of the external clock signal input from the input bonding pad X1 is a two-time system voltage (2×VDD), then the gate oxide layer of the P-type transistor P1 and the N-type transistor N2 can be damaged through a high voltage. The signal EN is controlled by the integrated circuit 100.

To resolve the gate oxide reliability problem, the P-type transistor P1 and the N-type transistor N1 can be switched to thick-oxide transistors. However, the circuit of the chip needs to have both thick-oxide and thin-oxide devices and the fabrication cost of the chip might be substantially increased.

SUMMARY OF THE INVENTION

Accordingly, the present invention is directed to a high/low voltage tolerant interface circuit and a crystal oscillator circuit using the same. The interface circuit and the crystal oscillator circuit not only can be applied to the design of mixed voltage circuit, but the gate oxide layer of their internal transistors can also have a higher degree of reliability.

According to an embodiment of the present invention, a high/low voltage tolerant interface circuit is provided. The interface circuit includes a first transistor, a bulk-voltage generator module and an bias module. A first source/drain of the first transistor is coupled to an input node. The bulk-voltage generator module is coupled to the first source/drain of the first transistor, and is used to determine whether a first voltage or a specific voltage is being provided to a bulk of the first transistor according to the voltage of the input node. The specific voltage is greater than the first voltage. The bias module is coupled to a gate of the first transistor. The bias module is used to provide an bias voltage to the gate of the first transistor and makes the first transistor conduct in order to control the voltage of a second source/drain of the first transistor.

According to another aspect, the present invention also provides a high/low voltage tolerant crystal oscillator circuit. The crystal oscillator circuit includes a crystal unit, a first transistor, a bulk-voltage generator module, an bias module and an inverter amplifier. The crystal unit is coupled between an input bonding pad and an output bonding pad, and is used for generating an oscillation signal. A first source/drain of the first transistor is coupled to the input bonding pad. The bulk-voltage generator module is coupled to the first source/drain of the first transistor, and is used to determine whether a first voltage or a specific voltage is being provided to a bulk of the first transistor according to the voltage of the input bonding pad. The specific voltage is greater than the first voltage. The bias module is coupled to a gate of the first transistor. The bias module is used to provide an bias voltage to the gate of the first transistor and makes the first transistor conduct in order to control the voltage of a second source/drain of the first transistor. An input end and an output end of the inverter amplifier are coupled to the second source/drain of the first transistor and the output bonding pad, respectively.

In an embodiment of the foregoing high/low voltage tolerant interface circuit and the crystal oscillator circuit using the same, the bias module includes a first circuit and a second circuit. The first circuit is coupled between the second source/drain and the gate of the first transistor, and is used for sensing the voltage of the second source/drain of the first transistor so as to provide an bias to the gate of the first transistor. The second circuit is coupled between the first source/drain and the gate of the first transistor, and is used for sensing the voltage of the first source/drain of the first transistor so as to determine whether to adjust the bias or not.

In an embodiment of the foregoing high/low voltage tolerant interface circuit and the crystal oscillator circuit using the same, the bulk-voltage generator module includes a sixth transistor and a seventh transistor. A first source/drain, a gate and a second source/drain of the sixth transistor are coupled to the first source/drain, the first voltage and the bulk of the first transistor, respectively. A first source/drain, a gate and a second source/drain of the seventh transistor are coupled to the first voltage, the gate of the first source/drain and the bulk of the first transistor, respectively.

The interface circuit of the present invention and the crystal oscillator circuit using the same can suitably adjust the bulk voltage of the transistor used for transmitting input signal and provide a suitable bias to the gate of the transistor according to the voltage change in the input node. As a result, the voltage transmitted to the output node can be adjusted. Furthermore, the interface circuit of the present invention and the crystal oscillator circuit using the interface circuit have high/low voltage tolerance and can be used in the design of mixed voltage circuit. In addition, the present invention can avoid possible damage due to punch through of the gate oxide layers of the internal transistors. Therefore, the internal transistors can have higher reliability of the gate oxide layers.

In order to make the aforementioned and other objects, features and advantages of the present invention comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
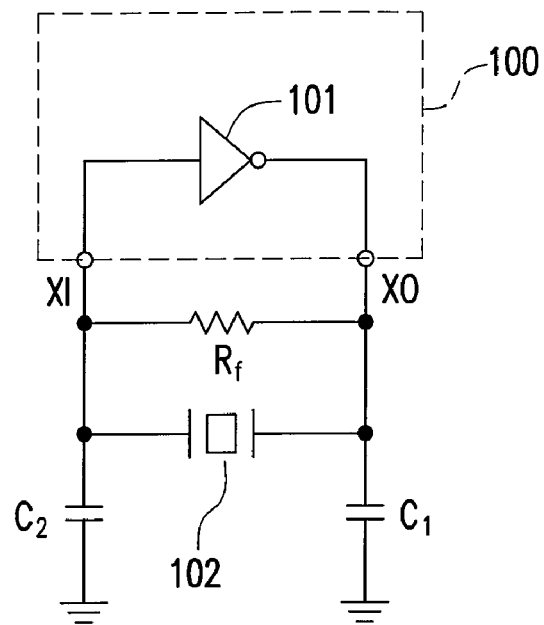
FIG. 1A is a diagram of a part of a conventional pierce-type crystal oscillator circuit.
Figure 1B:
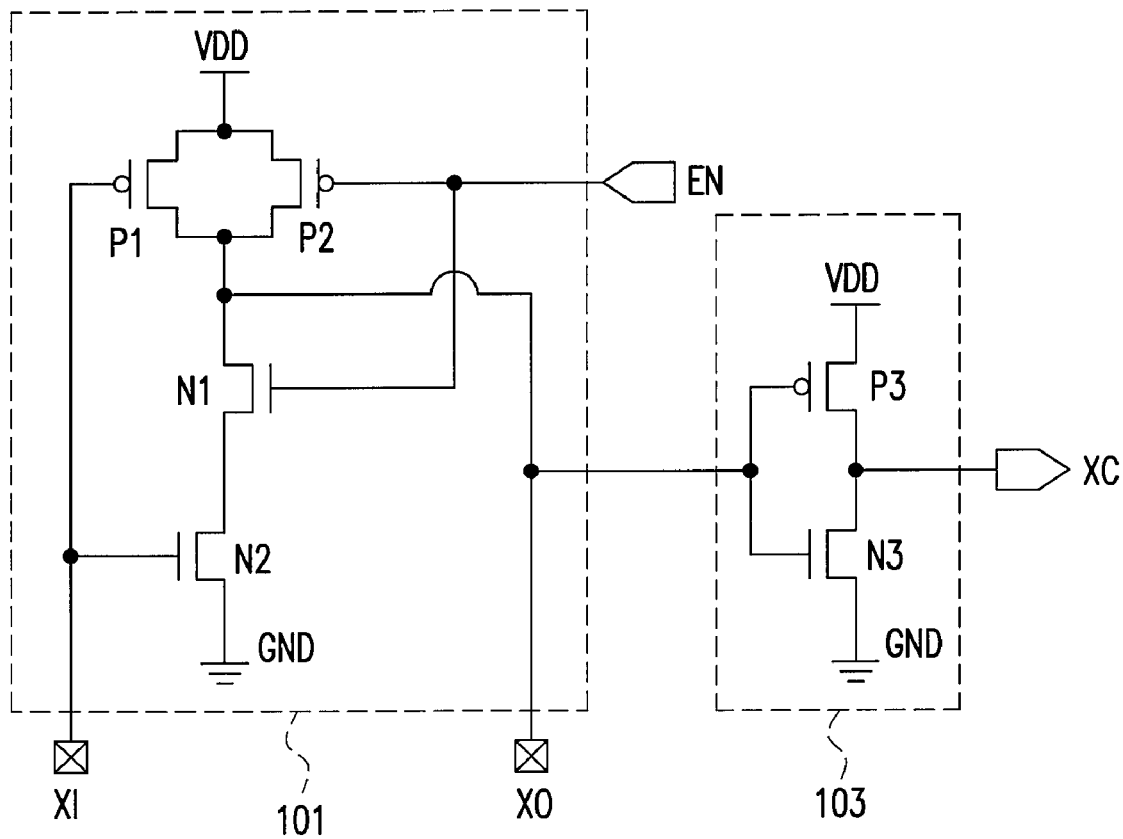
FIG. 1B is a diagram of a conventional crystal oscillator circuit having low voltage devices.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
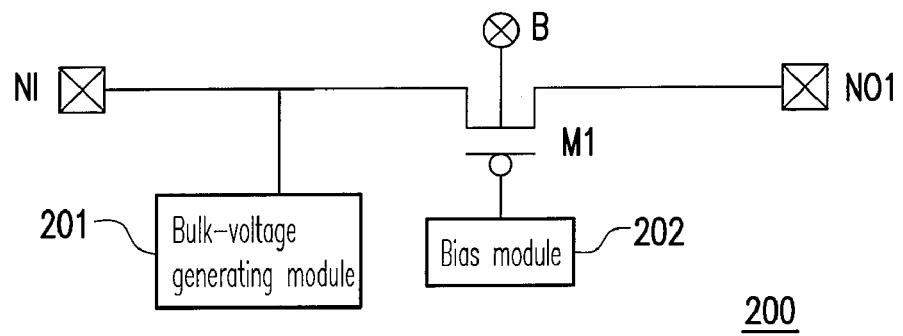
FIG. 2A is a block diagram of a high/low voltage tolerant interface circuit according to an embodiment of the present invention.

FIG. 2A is a block diagram of a high/low voltage tolerant interface circuit according to an embodiment of the present invention. The interface circuit 200 is built using low voltage devices and these low voltage devices are devices that operate at a one time the system voltage (1×VDD). As shown in FIG. 2A, the interface circuit 200 includes a transistor M1, a bulk-voltage generator module 201 and an bias module 202. Here, the transistor M1 is assumed to be a P-type metal-oxide-semiconductor (PMOS) transistor and the bulk B is implemented through an N-well layout.

A first source/drain and a second source/drain of the transistor. M1 are coupled to an input node N1 and an output node N01, respectively. The bulk-voltage generator module 201 determines whether to provide a first voltage or a specific voltage to the bulk B of the transistor M1 according to the voltage at the input node N1. The specific voltage is greater than the first voltage (for example, the system voltage VDD). The bias module 202 provides an bias to a gate of the transistor M1 so as to make the transistor M1 conduct and control the voltage of the second source/drain of the transistor M1. In the following, a more detailed description of the operation of each module is provided.

Figure 2B:
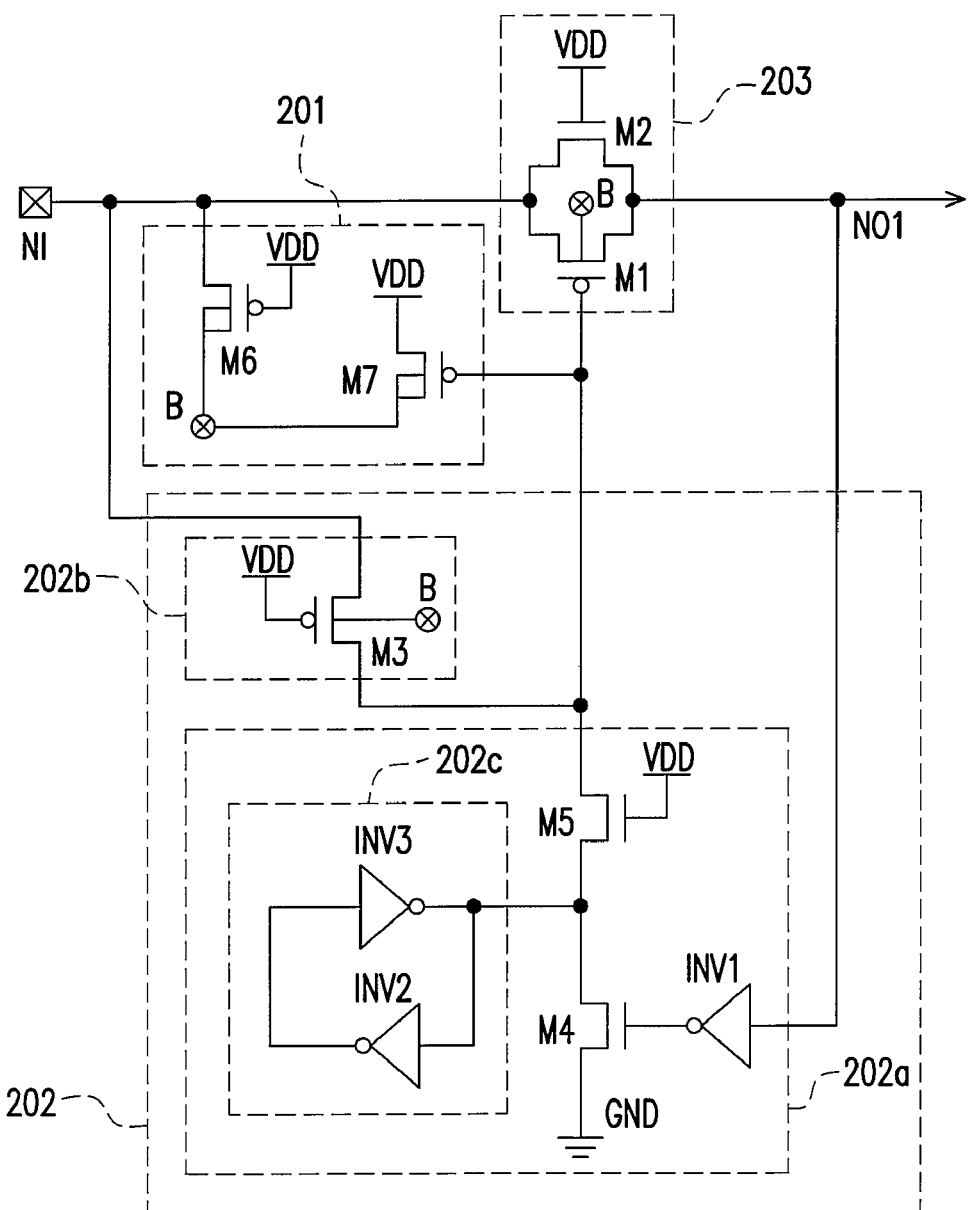
FIG. 2B is a circuit diagram of a high/low voltage tolerant interface circuit according to an embodiment of the present invention.

FIG. 2B is a circuit diagram of a high/low voltage tolerant interface circuit according to an embodiment of the present invention. As shown in FIG. 2B, a P-type transistor M1 and an N-type transistor M2 together form a transmission gate 203. In other words, a source and a drain of the transistor M2 are coupled to a source and a drain of the transistor M1, respectively, and a gate of the transistor M2 is coupled to a first voltage (the system voltage VDD).

The bulk-voltage generating circuit 201 includes P-type transistor M6~M7. A first source/drain and a gate of the transistor M6 are coupled to the first source/drain of the transistor M1 and the first voltage, respectively, and a second source/drain and a bulk of the transistor M6 are coupled to a bulk B of the transistor M1. A first source/drain and a gate of the transistor M7 are coupled to the first voltage and a gate of the transistor M1, respectively, and a second source/drain and a bulk of the transistor M7 are coupled to the bulk B of the transistor M1.

The bias module 202 includes a first circuit 202a and a second circuit 202b. The first circuit 202a is coupled between the gate and the second source/drain of the transistor M1, and is used for sensing the voltage of the second source/drain (the voltage at the node N01) of the transistor M1 so as to provide an bias to the gate of the transistor M1. The first circuit 202a includes an inverter INV1, N-type transistors M4~M5 and a latcher 202c comprising two inverters INV2~INV3. An input end and an output end of the inverter INV1 are coupled to the second source/drain of the transistor M1 and a gate of the transistor M4, respectively. A first source/drain and a second source/drain of the transistor M4 are coupled to a second voltage (for example, a ground voltage GND) and the latcher 202c, respectively. A first source/drain, a second source/drain and a gate of the transistor M5 are coupled to a second source/drain of the transistor M4, the gate of the transistor M1 and the first voltage (the system voltage VDD), respectively.

The second circuit 202b is coupled between the first source/drain and the gate of the transistor M1, and is used for sensing the voltage of the first source/drain (the voltage at the node N1) of the transistor M1 so as to determine whether to adjust the bias of the transistor M1. The second circuit 202b includes a P-type transistor M3. A first source/drain, a second source/drain and a bulk of the transistor M3 are coupled to the first source/drain, the gate and the bulk B of the transistor M1, respectively, and a gate of the transistor M3 is coupled to the first voltage.

Because the gate of the transistor M2 is coupled to the system voltage VDD, the voltage at the node N01 is a logic low when a logic low (for example, 0V) input voltage is applied to the input node N1. When the voltage at the node N01 is a logic low, the inverter INV1 inverts the logic low signal so as to make the transistor M4 conduct. Therefore, through the conductive transistors M4~M5, the first circuit 202a can provide a second voltage (a ground voltage GND here) to the gate of the transistor M1 so as to make the transistor M1 conduct. At this time, the latcher 202c can maintain the voltage level of the second source/drain of the transistor M4 at the logic low level so as to maintain the conductance of the transistor M1. Consequently, even if the logic high level of the input signal is greater than VDD−Vt and drives the transistor M2 to a cut-off state, the input signal can still be transmitted to the node N01 through the transistor M1. The aforementioned voltage Vt is the turn-on voltage of the transistor M2.

The latcher 202c can maintain the voltage level of the second source/drain of the transistor M4 at a low logic level so as to make the bias voltage (a logic low level at this time) provided by the first circuit 202a be maintained at a low logic level. At the same time, the transistor M3 is non-conductive. Therefore, the bias voltage provided by the first circuit 202a makes the transistor M7 conduct so that a first voltage (the system voltage VDD here) is being provided by the bulk-voltage generator module 201 to the bulk B of the transistor M1. Furthermore, because the voltage at the node N01 is smaller than or equal to the system voltage VDD, the transistor M6 does not conduct.

In addition, when an input signal of the ground voltage GND is applied to the input node X1, the bias module 202 can provide an bias with a second voltage (for example, a ground voltage GND) to the gate of the transistor M1 through the conductive transistor M4 so as to make the transistor M1 conduct. At this time, the transistor M6 does not conduct while the transistor M7 conducts. Therefore, the bulk-voltage generator module 201 provides a first voltage (a system voltage VDD here) to the bulk B of the transistor M1.

According to the foregoing embodiment, by providing a first voltage or a specific voltage to the bulk of the transistor M1 through the bulk-voltage generator module 201 and providing an bias to the gate of the transistor M' through the bias module 202 can effectively control the voltage level at the node N01. Therefore, the interface circuit 200 in the embodiment of the present invention has a high/low voltage tolerance characteristic.

Figure 3A:
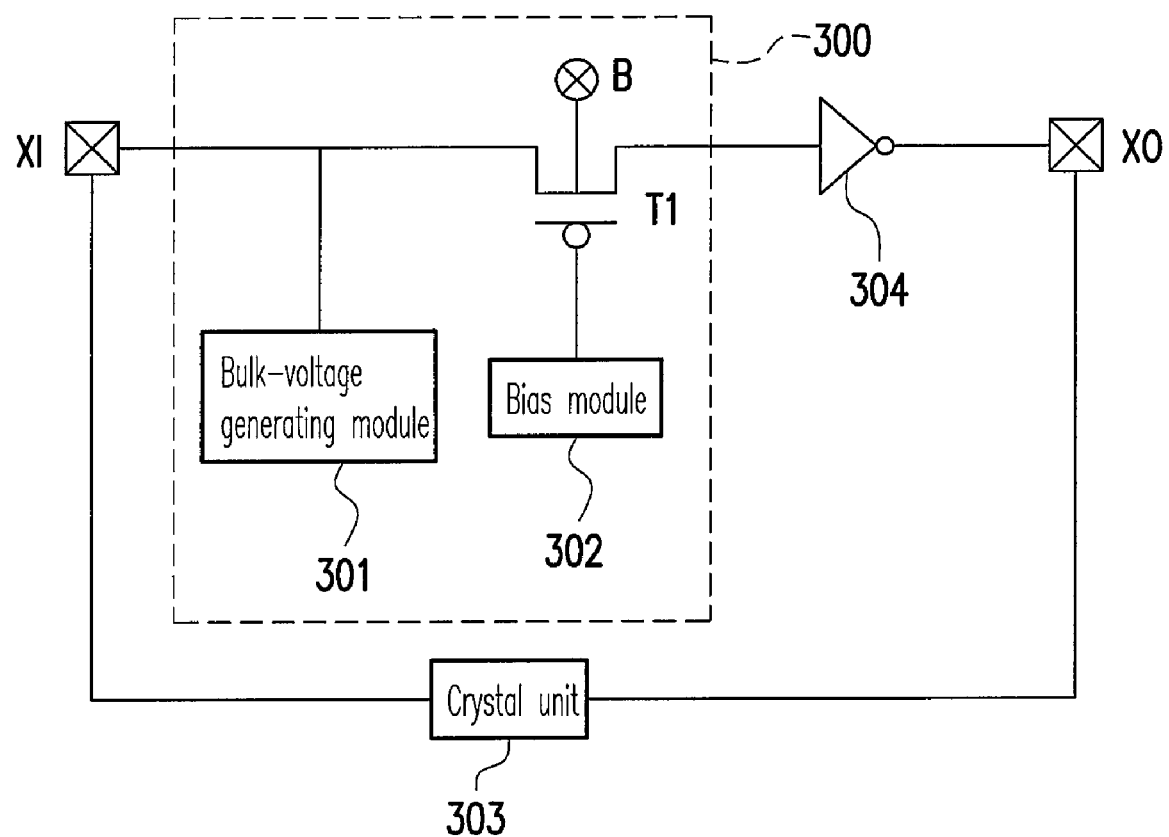
FIG. 3A is a block diagram of a high/low voltage tolerant crystal oscillator circuit according to an embodiment of the present invention.

In the following, another embodiment is provided so that those skilled in the art may easily apply the present invention. FIG. 3A is a block diagram of a high/low voltage tolerant crystal oscillator circuit according to an embodiment of the present invention. As shown in FIG. 3A, the crystal oscillator circuit 300 includes a transistor T1, a bulk-voltage generator module 301, an bias module 302, a crystal unit 303 and an inverter amplifier 304. Here, the transistor T1 is assumed to be a PMOS transistor and the bulk B is implemented using an N-well layout.

As shown in FIGS. 2A and 3A, the main difference between FIG. 3A and FIG. 2A is that the interface circuit 300 is additionally coupled to the inverter amplifier 304. In other words, the first and the second source/drain of the transistor T1 are coupled to the input node X1 and an input end of the inverter amplifier 304, respectively, and an output end of the inverter amplifier 304 is coupled to the output node XO. The crystal unit 303 is coupled between the input node X1 and an input bonding pad wile the output node XO is coupled to an output bonding pad.

Figure 3B:
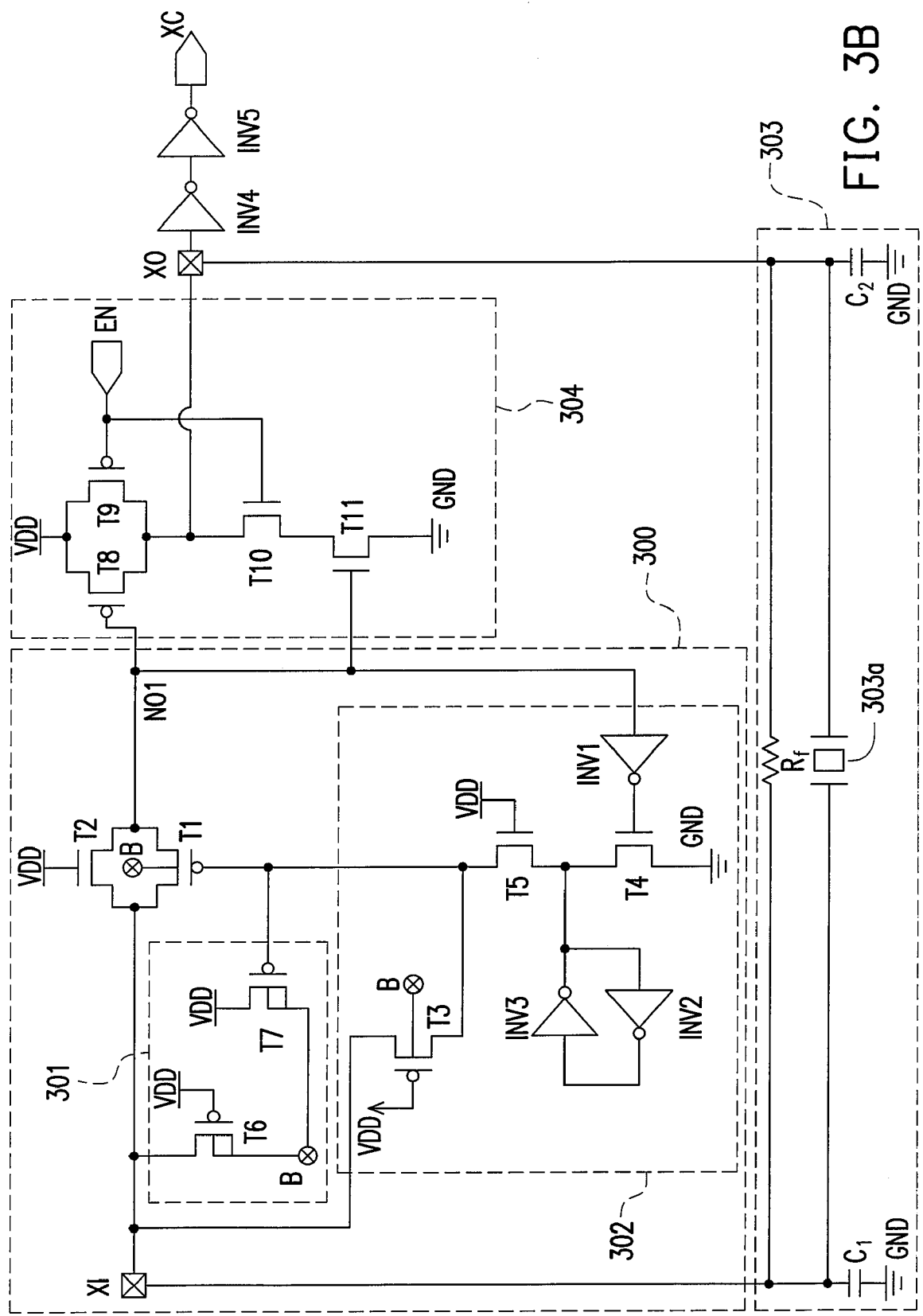
FIG. 3B is a circuit diagram of a high/low voltage tolerant crystal oscillator circuit according to an embodiment of the present invention.

FIG. 3B is a circuit diagram of a high/low voltage tolerant crystal oscillator circuit according to an embodiment of the present invention. As shown in FIG. 3B, the crystal unit 303 includes a crystal 303a, a resistor $R_f$ and capacitors C1~C2. A first end and a second end of the crystal 303a are coupled to the input node X1 and the output node XO, respectively. A first end and a second end of the resistor $R_f$ are coupled to the first and the second end of the crystal 303a, respectively. A first end and a second end of the capacitor C1 are coupled to the first end of the crystal 303a and a second voltage (for example, a ground voltage GND), respectively. A first end and a second end of the capacitor C2 are coupled to the second end of the crystal 303a and the second voltage, respectively.

Since the operation of the crystal unit 303 can be described with reference to FIG. 1A, a detailed description thereof is omitted. The oscillation signal S1 generated by the crystal unit 303 is a sine wave signal. When the voltage level of the oscillation signal S1 is smaller than or equal to (VDD−Vt), the oscillation signal S1 is transmitted to the node N01 through the conductive transistor T2, that is, the input end of the inverter amplifier 304.

When the voltage at the node N01 is a logic low level, the bias module provides an bias with a second voltage to the gate of the transistor T1 so as to make the transistor T1 conduct. Therefore, even if the voltage level of the oscillation signal S1 is larger than VDD−Vt, the oscillation signal S1 can still be transmitted to the node N01 through the conductive transistor T1. At the same time, the bias module 302 provides an bias with the second voltage to make the transistor T7 conduct and the bulk-voltage generator module 301 provides the first voltage to the bulk of the transistor T1.

The inverter amplifier 304 includes P-type transistors T8~T9, N-type transistors T10~T11, wherein the signal EN is controlled by the integrated circuit that provides a clock signal. After the inverter amplifier 304 has provided a voltage gain and phase-shifted the oscillation signal S1 by 180°, the inverters INV4~INV5 convert the sine wave oscillation signal S1 into square wave clock signal and output the signal to the integrated circuit from the node XC.

When the crystal oscillator circuit operates by receiving an external clock signal, the voltage level of the external clock signal can be a one time the system voltage or a two times the system voltage and is received through the input node. Therefore, the voltage transmitted to the gate of the transistors T8 and T11 inside the inverter amplifier 304 must be limited to avoid a punch through of the gate oxide of the transistors T8 and T11 due to high voltage. The circuit design of the present embodiment utilizes a transistor T3 inside the bias module 302 to sense the voltage at the first source/drain of the transistor T1 so as to determine whether to adjust the bias being provided to the gate of the transistor T1.

When the voltage level of the external clock signal exceeds VDD+|Vtp| (for example, two times the system voltage 2×VDD), the transistor T3 conducts. Through the conductive transistor T3, the gate voltage of the transistor T1 is increased to two times the system voltage 2×VDD so as to make the transistor T1 non-conductive. Hence, an external clock signal having a high voltage level being directly transmitted to the node N01 through the transistor T1 can be avoided. At this time, the transistor T6 conducts while the transistor T7 is non-conductive. Therefore, the bulk-voltage generator module 301 provides a two times the system voltage 2×VDD to the bulk B of the transistor T1 so as to lower the voltage level of the high voltage level external clock signal transmitted to the node N01.

Figure 4A:
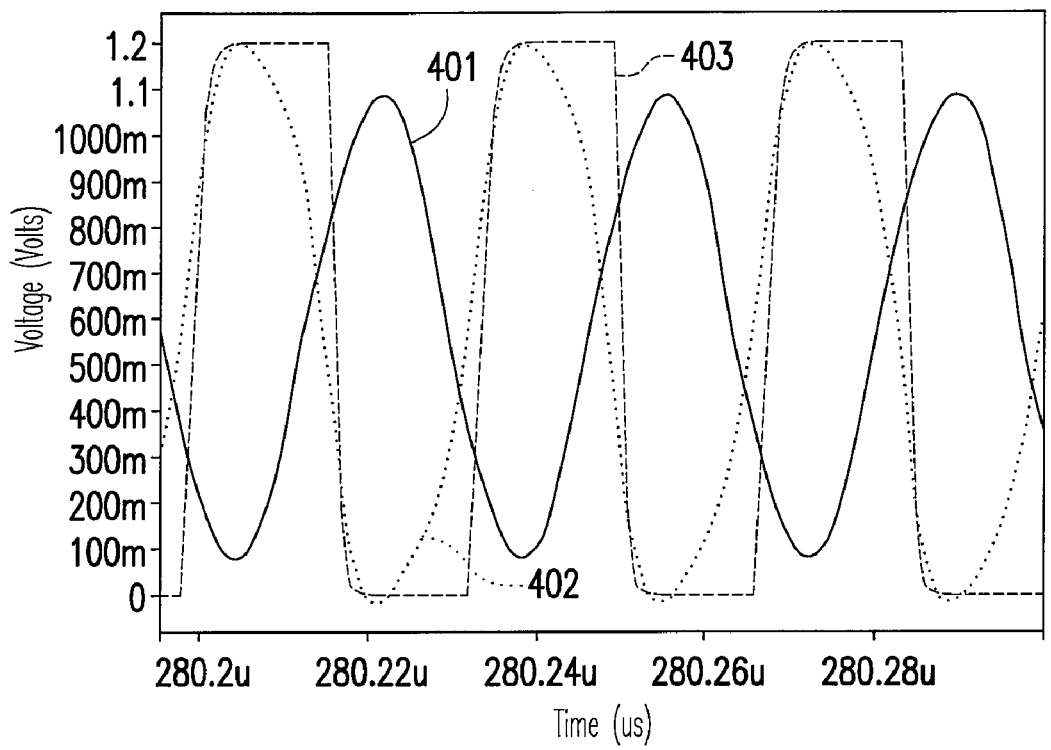
FIGS. 4A and 4B are waveform diagrams of the input and output signals produced by crystal oscillator circuits according to an embodiment of the present invention.
Figure 4B:
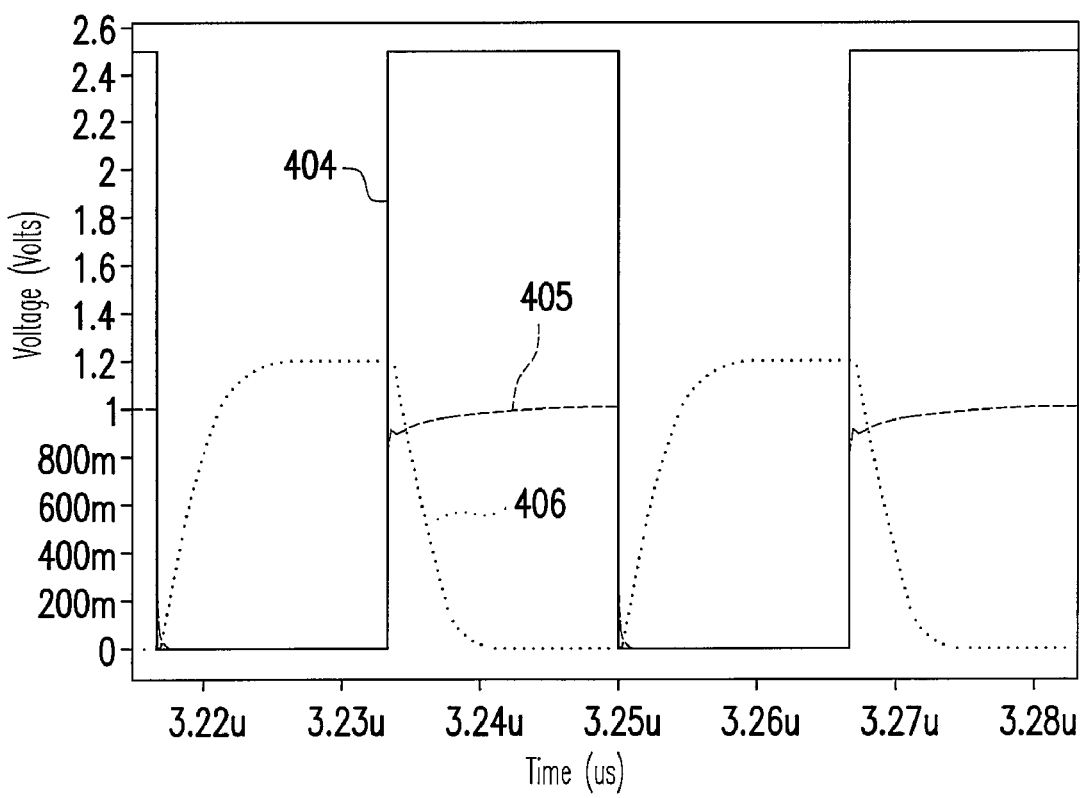

The crystal oscillator circuit of the present embodiment can be implemented using 130 nanometer, 1.2 volts (V) CMOS process and applied to a 1.2V/2.5V mixed voltage interface circuit. Through experimental simulations, the output waveforms of the crystal oscillator circuit according to an embodiment of the present invention are shown in FIGS. 4A and 4B. As shown in FIG. 4A, the crystal oscillator circuit uses a 30 MHz base frequency crystal and a 20 pico-farad (pF) load capacitor to generate a 30 MHz clock signal. The waveform 401 is the signal measured at the input node X1, the waveform 402 is the signal measured at the output node XO, and the waveform 403 is the signal measured at the node XC for outputting clock signal. As shown in FIG. 4A, the voltage level at the node XC is below the one time the system voltage 1×VDD.

As shown in FIG. 4B, a 30 MHz external clock signal is being provided to the input node X1 and the voltage level of the external clock signal is a two time system voltage. Furthermore, a load capacitor of 20 pF is disposed at the node XC for outputting the clock signal. The waveform 404 is the signal measured at the input node X1, the waveform 405 is the signal measured at the node N01, and the waveform 406 is the signal measured at the node XC for outputting the clock signal. As shown in FIG. 4B, the voltage level of the node N01, that is, the bias provided to the transistors T8 and T1 inside the inverter amplifier 304, is limited to 1V. After a voltage gain and a phase shift of 180° of the voltage level of the node N01 has been provided by the inverter amplifier 304, the voltage level of the node XC attains a one time the system voltage 1×VDD.

In summary, the interface circuit in the embodiment of the present invention accordingly adjusts the bulk voltage of the transistor used for transmitting the input signal through the bulk-voltage generator module when the voltage level of the input node is changed. Furthermore, the bias module also adjusts the bias being provided to the gate of the transistor so as to make it conduct according to the voltage level of the input node. Thus, through the mutual cooperation between the bulk-voltage generator module and the bias module, the voltage level at the output node can be effectively controlled. The application of the crystal oscillator circuit in the embodiment of the present invention to a mixed voltage interface circuit can also increase the reliability of the gate oxide layer of the internal transistors and avoid damage to the gate oxide layer due to high voltage punch through.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A high/low voltage tolerant interface circuit, comprising:
   a first transistor, having a gate, a first source/drain, a second source/drain and a bulk, wherein the first source/drain is coupled to an input node;
   a bulk-voltage generator module, coupled to the first source/drain of the first transistor for determining whether a first voltage or a predetermined voltage is being provided to the bulk of the first transistor according to a voltage of the input node, wherein the predetermined voltage is greater than the first voltage; and
   a bias module, coupled to the gate of the first transistor for providing a bias to the gate of the first transistor so as to make the first transistor conduct and control a voltage of the second source/drain of the first transistor, wherein the bias module comprises:
   a first circuit, coupled between the second source/drain and the gate of the first transistor for sensing a voltage of the second source/drain of the first transistor so as to provide the bias to the gate of the first transistor; and
   a second circuit, coupled between the first source/drain and the gate of the first transistor for sensing a voltage of the first source/drain of the first transistor and determining whether or not to adjust the bias.

2. The high/low voltage tolerant interface circuit according to claim 1, wherein the first voltage is a system voltage.

3. The high/low voltage tolerant interface circuit according to claim 1, wherein the input node is an input bonding pad.

4. The high/low voltage tolerant interface circuit according to claim 1, further comprising:
   a second transistor, having a first and a second source/drain coupled to the first and the second source/drain of the first transistor, respectively, and a gate coupled to the first voltage.

5. The high/low voltage tolerant interface circuit according to claim 1, wherein the second circuit comprises:
   a third transistor having a first source/drain coupled to the first source/drain of the first transistor, a gate coupled to the first voltage, a second source/drain coupled to the gate of the first transistor, and a bulk coupled to the bulk of the first transistor.

6. The high/low voltage tolerant interface circuit according to claim 1, wherein the first circuit comprises:
   a first inverter, having an input end coupled to the second source/drain of the first transistor;
   a fourth transistor, having a first source/drain coupled to a second voltage, and a gate coupled to an output end of the first inverter;
   a fifth transistor, having a first source/drain coupled to a second source/drain of the fourth transistor, a gate coupled to the first voltage, and a second source/drain coupled to the gate of the first transistor; and
   a latcher, coupled to the second source/drain of the fourth transistor.

7. The high/low voltage tolerant interface circuit according to claim 6, wherein the second voltage is a ground voltage.

8. The high/low voltage tolerant interface circuit according to claim 6, wherein the latcher comprises:
   a second inverter, having an input end coupled to the second source/drain of the fourth transistor; and
   a third inverter, having an input end coupled to an output end of the second inverter, and an output end coupled to the input end of the second inverter.

9. The high/low voltage tolerant interface circuit according to claim 1, wherein the bulk-voltage generator module comprises:

a sixth transistor, having a first source/drain coupled to the first source/drain of the first transistor, a gate coupled to the first voltage, a second source/drain and a bulk coupled to the bulk of the first transistor; and a seventh transistor, having a first source/drain coupled to the first voltage, a gate coupled to the gate of the first transistor, a second source/drain and a bulk coupled to the bulk of the first transistor.

10. The high/low voltage tolerant interface circuit according to claim 1, further comprising:

an inverter amplifier, having an input end coupled to the second source/drain of the first transistor, and an output end coupled to an output node.

11. The high/low voltage tolerant interface circuit according to claim 10, wherein the output node is an output bonding pad.

12. The high/low voltage tolerant interface circuit according to claim 10, wherein the inverter amplifier comprises:

an eighth transistor, having a source/drain coupled to the first voltage, a gate coupled to the second source/drain of the first transistor, a second source/drain coupled to the output node;

a ninth transistor, having a first source/drain coupled to the first source/drain of the eighth transistor, a gate for receiving an enable signal, a second source/drain coupled to the second source/drain of the eighth transistor;

a tenth transistor, having a first source/drain coupled to the second source/drain of the eighth transistor, and a gate coupled to the gate of the ninth transistor; and an eleventh transistor, having a first source/drain coupled to a second source/drain of the tenth transistor, a gate coupled to the gate of the eighth transistor, and a second source/drain coupled to a second voltage.

13. A high/low voltage tolerant crystal oscillator circuit, comprising:

a crystal unit, coupled between an input bonding pad and an output bonding pad for providing an oscillation signal;

a first transistor, having a gate, a first source/drain, a second source/drain, and a bulk, wherein the first source/drain is coupled to the input bonding pad;

a bulk-voltage generator module, coupled to the first source/drain of the first transistor for determining whether a first voltage or a predetermined voltage is being provided to the bulk of the first transistor according to a voltage of the input bonding pad, wherein the predetermined voltage is greater than or equal to the first voltage;

a bias module, coupled to the gate of the first transistor for providing a bias to the gate of the first transistor so as to make the first transistor conduct and control a voltage of the second source/drain of the first transistor; and an inverter amplifier, having an input end coupled to the second source/drain of the first transistor, and an output end coupled to the output bonding pad.

14. The high/low voltage tolerant crystal oscillator circuit according to claim 13, wherein the first voltage is a system voltage.

15. The high/low voltage tolerant crystal oscillator circuit according to claim 13, further comprising:

a second transistor, having a first source/drain coupled to the first source/drain of the first transistor, a gate coupled to the first voltage, and a second source/drain coupled to the second source/drain of the first transistor.

16. The high/low voltage tolerant crystal oscillator circuit according to claim 13, wherein the bias module comprises:

a first circuit, coupled between the second source/drain and the gate of the first transistor for sensing a voltage of the second source/drain of the first transistor so as to provide the bias to the gate of the first transistor; and a second circuit, coupled between the first source/drain and the gate of the first transistor for sensing a voltage of the first source/drain of the first transistor and determining whether to adjust the bias or not.

17. The high/low voltage tolerant crystal oscillator circuit according to claim 16, wherein the second circuit comprises:

a third transistor having a first source/drain coupled to the first source/drain of the first transistor, a gate coupled to the first voltage, a second source/drain coupled to the gate of the first transistor, and a bulk coupled to the bulk of the first transistor.

18. The high/low voltage tolerant crystal oscillator circuit according to claim 16, wherein the first circuit comprises:

a first inverter, having an input end coupled to the second source/drain of the first transistor;

a fourth transistor, having a first source/drain coupled to a second voltage, and a gate coupled to an output end of the first inverter;

a fifth transistor, having a first source/drain coupled to a second source/drain of the fourth transistor, a gate coupled to the first voltage, and a second source/drain coupled to the gate of the first transistor; and a latcher, coupled to the second source/drain of the fourth transistor.

19. The high/low voltage tolerant crystal oscillator circuit according to claim 18, wherein the second voltage is a ground voltage.

20. The high/low voltage tolerant crystal oscillator circuit according to claim 18, wherein the latcher comprises:

a second inverter, having an input end coupled to the second source/drain of the fourth transistor; and a third inverter, having an input end coupled to an output end of the second inverter, and an output end coupled to the input end of the second inverter.

21. The high/low voltage tolerant crystal oscillator circuit according to claim 13, wherein the bulk-voltage generator module comprises:

a sixth transistor, having a first source/drain coupled to the first source/drain of the first transistor, a gate coupled to the first voltage, a second source/drain and a bulk coupled to the bulk of the first transistor; and a seventh transistor, having a first source/drain coupled to the first voltage, a gate coupled to the gate of the first transistor, a second source/drain and a bulk coupled to the bulk of the first transistor.

22. The high/low voltage tolerant crystal oscillator circuit according to claim 13, wherein the inverter amplifier comprises:

an eighth transistor, having a source/drain coupled to the first voltage, a gate coupled to the second source/drain of the first transistor, a second source/drain coupled to the output bonding pad;

a ninth transistor, having a first source/drain coupled to the first source/drain of the eighth transistor, a gate for receiving an enable signal, a second source/drain coupled to the second source/drain of the eighth transistor;

a tenth transistor, having a first source/drain coupled to the second source/drain of the eighth transistor, and a gate coupled to the gate of the ninth transistor; and an eleventh transistor, having a first source/drain coupled to a second source/drain of the tenth transistor, a gate coupled to the gate of the eighth transistor, and a second source/drain coupled to a second voltage.

23. The high/low voltage tolerant crystal oscillator circuit according to claim 13, the crystal unit comprises:

a crystal, having a first end coupled to the input bonding pad, and a second end coupled to the output bonding pad;

a resistor, having a first end coupled to the first end of the crystal, and a second end coupled to the second end of the crystal;

a first capacitor, having a first end coupled to the first end of the crystal, and having a second end coupled to a second voltage; and a second capacitor, having a first end coupled to the second end of the crystal, and a second end coupled to the second voltage.

* * * * *